US009334935B2

(12) United States Patent
Nishimura et al.

(10) Patent No.: US 9,334,935 B2
(45) Date of Patent: May 10, 2016

(54) MOVING MECHANISM, ELECTRONIC COMPONENT TRANSPORT DEVICE, ELECTRONIC COMPONENT INSPECTION DEVICE (71) Applicant: Seiko Epson Corporation, Tokyo (JP)

(72) Inventors: Yoshiteru Nishimura, Shiojiri (JP); Osamu Miyazawa, Suwa (JP)

(73) Assignee: Seiko Epson Corporation (JP)

( * ) Notice: Subject to any disclaimer, the term of this patent is extended or adjusted under 35 U.S.C. 154(b) by 399 days.

(21) Appl. No.: 13/915,148

(22) Filed: Jun. 11, 2013

(65) Prior Publication Data

US 2013/0330153 A1 Dec. 12, 2013

(30) Foreign Application Priority Data

Jun. 12, 2012 (JP) .................. 2012-132651

(51) Int. Cl.
*H02N 2/02* (2006.01)
*F16H 21/44* (2006.01)
*H01L 41/09* (2006.01)
*H02N 2/00* (2006.01)

(52) U.S. Cl.
CPC ............ *F16H 21/44* (2013.01); *H01L 41/0913* (2013.01); *H02N 2/0055* (2013.01); *H02N 2/0095* (2013.01); *H02N 2/026* (2013.01); *Y10T 74/18888* (2015.01)

(58) Field of Classification Search
CPC ......... H02N 2/02; H02N 2/026; H02N 2/028; H01L 41/04; H01L 41/08; H01L 41/0926
USPC .................. 310/323.01–323.21, 328
See application file for complete search history.

(56) References Cited

U.S. PATENT DOCUMENTS

| 6,252,333 B1* | 6/2001 | Iino et al. ................. 310/323.17 |
| 8,084,920 B2 | 12/2011 | Kawai |
| 8,164,233 B2 | 4/2012 | Mukae |
| 2008/0240704 A1 | 10/2008 | Takahashi |

(Continued)

FOREIGN PATENT DOCUMENTS

| JP | 05-016172 | 3/1993 |
| JP | 05-288216 | 11/1993 |

(Continued)

OTHER PUBLICATIONS

Extended European Search Report for Application No. EP 13 17 1416 dated Oct. 28, 2013 (5 pages).

*Primary Examiner* — Derek Rosenau
(74) *Attorney, Agent, or Firm* — Harness, Dickey & Pierce, P.L.C.

(57) ABSTRACT

A moving mechanism includes a first moving body arranged to move in a first direction relative to a support, a second moving body provided on a side of the support with the first moving body therebetween, and moves in a second direction intersecting the first direction relative to the first moving body, and a first vibrating body arranged in the support and biased to press the moving body or is arranged in the first moving body and biased to press the support. A direction in which first and second grooves face each other intersects a direction in which the support and the moving body face each other, and a biasing direction in which the first vibrating body is biased intersects the direction in which the first and second grooves face each other and the direction in which the support and the moving body face each other.

16 Claims, 6 Drawing Sheets (56) References Cited

U.S. PATENT DOCUMENTS

2009/0230818 A1* 9/2009 Mukae et al. ............ 310/323.16
2010/0086484 A1 4/2010 Katase et al.
2010/0171392 A1 7/2010 Mukae
2013/0140952 A1 6/2013 Kamijo et al.

FOREIGN PATENT DOCUMENTS

| JP | 09-001436 | 1/1997 |
| JP | 11-271480 | 10/1999 |
| JP | 2010-091348 A | 4/2010 |
| JP | 4772626 B2 | 9/2011 |

* cited by examiner

MOVING MECHANISM, ELECTRONIC COMPONENT TRANSPORT DEVICE, ELECTRONIC COMPONENT INSPECTION DEVICE

BACKGROUND

1. Technical Field

The present invention relates to a moving mechanism, an electronic component transport device, and an electronic component inspection device.

2. Related Art

Various devices which are equipped with a moving mechanism moving a moving body in a predetermined direction with respect to a support are known. For example, in a robot described in JP-UM-A-5-16172, a plurality of rolling bodies (balls) are inserted between rails provided parallel to a moving direction and rail receivers fitted with the rails pinched from both sides, and two rows of ball guides (moving shafts) parallel to the moving direction are formed. In this moving mechanism, if a driving force generated by a driving motor or the like is transmitted to the moving body, the balls roll between the rails and rail receivers, whereby the moving body can be smoothly moved.

A moving mechanism in which a plurality of moving bodies having different moving directions are combined is also known, and for example, as disclosed in JP-A-11-271480, a first moving body which is movable in an X-axis direction with respect to a support and a second moving body which is movable in a Y-axis direction with respect to the first moving body are superimposed, thereby allowing the movement of the second moving body on an X-Y plane.

However, as in JP-UM-A-5-16172, in the moving mechanism in which the moving body is supported by the two rows of moving shafts, a load or the like is applied to the moving body, causing a problem in that backlash sometimes occurs in the moving body. In particular, in a moving mechanism including a plurality of moving bodies, backlash which occurs in one moving body is transmitted to other moving bodies, sometimes causing a large backlash in the entire moving mechanism.

SUMMARY

One goal of the present invention is to solve at least a part of the above-described problems. An advantage of some aspects of the invention is that it provides a moving mechanism capable of suppressing backlash in a moving body.

A moving mechanism according to an aspect of the invention has the following configuration in order to solve at least a part of the above-described problems. That is, the moving mechanism includes a support which is provided at a predetermined position and supports the moving mechanism, a first moving body which is movable in a first direction with respect to the support, a first vibrating body which includes a piezoelectric material to generate vibration in the first direction and is supported by one of the support and the first moving body while being biased toward the other one of the support and the first moving body, a second moving body which is provided on a side of the support with the first moving body therebetween, is moved with the movement of the first moving body, and is movable in a second direction intersecting the first direction with respect to the first moving body, a second vibrating body which includes a piezoelectric material to generate vibration in the second direction and is supported by one of the first moving body and the second moving body while being biased toward the other one of the first moving body and the second moving body, a pair of first grooves which are provided in the support and formed parallel to the first direction, a pair of second grooves which are provided in the first moving body and formed to face the first grooves, a plurality of rolling bodies which are provided between the first grooves and the second grooves, and roll in accordance with movement of the first moving body, and a moving shaft which includes the rolling bodies and is parallel to the first direction, in which two rows of the moving shafts are spaced apart from each other in a direction intersecting a direction in which the support and the first moving body face each other, a direction in which the first grooves and the second grooves face each other intersects a direction in which the support and the first moving body face each other, and the positional relationship between the first grooves and the second grooves is reversed between the two rows of moving shafts, and a biasing direction in which the first vibrating body is biased is inclined with respect to a moving surface including the two rows of moving shafts.

It is assumed that the term "the direction which is inclined with respect to the moving surface" used herein does not include a direction parallel to the moving surface or a direction perpendicular to the moving surface.

In this moving mechanism, if the first vibrating body is supported on the support side, the first moving body receives the biasing force of the first vibrating body, and if the first vibrating body is supported on the first moving body side, the first moving body receives the reaction force in a direction opposite to the biasing direction of the first vibrating body. Since the biasing direction of the first vibrating body is inclined with respect to the moving surface, the biasing force or the reaction force which is received by the first moving body includes a component parallel to the moving surface and a component perpendicular to the moving surface. The first moving body receives the force parallel to the moving surface, whereby in one moving shaft of the two rows of moving shafts, the clearance between the first grooves and the second grooves in a direction parallel to the moving surface is narrowed, and the rolling bodies are pinched between the first grooves and the second grooves. In the other moving shaft, while the clearance between the first grooves and the second grooves is extended, the first moving body receives the force perpendicular to the moving surface, whereby a moment which allows the rotation of the first moving body with one moving shaft as a rotation axis is generated, and thus the rolling bodies are pinched between the first grooves and the second grooves in a direction perpendicular to the moving surface. As a result, it is possible to suppress backlash of the first moving body. In this way, backlash of the first moving body which is arranged close to the support and receives the weight of the second moving body is suppressed, thereby increasing the rigidity of the entire moving mechanism.

In the moving mechanism, when the support is arranged in a transfer body which is capable of transferring the moving mechanism in a predetermined direction, the first direction may be different from the transfer direction of the transfer body.

As the transfer body transfers the moving mechanism, an inertial force acts on the moving mechanism in the transfer direction of the transfer body. If the first direction is different from the transfer direction of the transfer body, it is difficult for an inertial force to act on the first moving body in the moving direction. As a result, even if the first moving body arranged close to the support receives the weight of the second moving body, it is possible to suppress misalignment (skidding in the moving direction) of the first moving body by the inertial force. If the weight which is applied to the second moving body is reduced, even when the second direction and the transfer direction of the transfer body overlap each other, a large inertial force is not applied to the second moving body, thereby suppressing misalignment (skidding in the moving direction) of the second moving body. As a result, it is not necessary to further provide a brake mechanism or the like so as to prevent misalignment by the inertial force, thereby achieving a reduction in the size of the moving mechanism.

In the moving mechanism, a rotating body which rotates around a third direction perpendicular to the first direction and the second direction as an axis, and a third vibrating body which generates vibration to drive the rotating body may be provided, and the direction of vibration to be generated by the third vibrating body may be different from the transfer direction of the transfer body. It is assumed that the term "perpendicular" used herein is not limited to totally perpendicular and includes roughly perpendicular.

In this way, if the vibration direction of the third vibrating body is different from the transfer direction of the transfer body, even when an inertial force is applied to the moving mechanism along with the transfer by the transfer body, a direction in which the third vibrating body drives the rotating body by vibration (a direction in which the driving force of the vibrating body is transmitted to the rotating body) and an inertial direction do not overlap each other. As a result, it is possible to suppress misalignment (skidding in the rotation direction) of the rotating body by the inertial force.

In the moving mechanism, in a portion of one of the support and the first moving body to which the first vibrating body is biased, a pressure receiving body which is substantially formed in a rectangular parallelepiped shape may be provided or buried in a posture such that a surface to which the first vibrating body is biased and the biasing direction are perpendicular to each other.

With this configuration, even when the first vibrating body is obliquely biased with respect to the support or the first moving body, the pressure receiving body is not dislodged due to the biasing force (the position of the pressure receiving body is shifted in a direction parallel to the moving surface), and the driving force of the vibrating body can be appropriately transmitted to the pressure receiving body, thereby moving the first moving body with respect to the support with high precision.

In the moving mechanism, the pressure receiving body may be formed of a material having a hardness that is higher than the support or the first moving body in which the pressure receiving body is buried.

With this configuration, it is possible to suppress abrasion of the pressure receiving body by a frictional force which acts between the first vibrating body and the pressure receiving body. As a result, it is possible to suppress degradation in the movement precision of the moving body even after long-term use.

Embodiments of the invention may be implemented in the following form. That is, embodiments of the invention may be implemented as an electronic component transport device including a holding unit which holds an electronic component, and a moving mechanism which moves the holding unit holding the electronic component, in which the moving mechanism includes a support which is provided at a predetermined position and supports the moving mechanism, a first moving body which is movable in a first direction with respect to the support, a first vibrating body which includes a piezoelectric material to generate vibration in the first direction and is supported by one of the support and the first moving body while being biased toward the other one of the support and the first moving body, a second moving body which is provided on a side of the support with the first moving body therebetween, is moved with the movement of the first moving body, and is movable in a second direction intersecting the first direction with respect to the first moving body, a second vibrating body which includes a piezoelectric material to generate vibration in the second direction and is supported by one of the first moving body and the second moving body while being biased toward the other one of the first moving body and the second moving body, a pair of first grooves which are provided in the support and formed parallel to the first direction, a pair of second grooves which are provided in the first moving body and formed to face the first grooves, a plurality of rolling bodies which are provided between the first grooves and the second grooves, and roll in accordance with movement of the first moving body, and a moving shaft which includes the rolling bodies and is parallel to the first direction, two rows of the moving shafts are spaced apart from each other in a direction intersecting a direction in which the support and the first moving body face each other, a direction in which the first grooves and the second grooves face each other intersects a direction in which the support and the first moving body face each other, and the positional relationship between the first grooves and the second grooves is reversed between the two rows of moving shafts, and a biasing direction in which the first vibrating body is biased is inclined with respect to a moving surface including the two rows of moving shafts.

In this electronic component transport device, it is possible to suppress backlash of the moving mechanism, making it possible to increase the precision of transferring an electronic component.

Embodiments of the invention may also be implemented in the following form. That is, embodiments of the invention may be implemented as an electronic component inspection device including a holding unit which holds an electronic component, a moving mechanism which moves the holding unit holding the electronic component, and an inspection unit which inspects the electronic component, in which the moving mechanism includes a support which is provided at a predetermined position and supports the moving mechanism, a first moving body which is movable in a first direction with respect to the support, a first vibrating body which includes a piezoelectric material to generate vibration in the first direction and is supported by one of the support and the first moving body while being biased toward the other one of the support and the first moving body, a second moving body which is provided on a side of the support with the first moving body therebetween, is moved with the movement of the first moving body, and is movable in a second direction intersecting the first direction with respect to the first moving body, a second vibrating body which includes a piezoelectric material to generate vibration in the second direction and is supported by one of the first moving body and the second moving body while being biased toward the other one of the first moving body and the second moving body, a pair of first grooves which are provided in the support and formed parallel to the first direction, a pair of second grooves which are provided in the first moving body and formed to face the first grooves, a plurality of rolling bodies which are provided between the first grooves and the second grooves, and roll in accordance with movement of the first moving body, and a moving shaft which includes the rolling bodies and is parallel to the first direction, two rows of the moving shafts are spaced apart from each other in a direction intersecting a direction in which the support and the first moving body face each other, a direction in which the first grooves and the second grooves face each other intersects a direction in which the support and the first moving body face each other, and the positional relationship between the first grooves and the second grooves is reversed between the two rows of moving shafts, and a biasing direction in which the first vibrating body is biased is inclined with respect to a moving surface including the two rows of moving shafts.

In this electronic component inspection device, it is possible to suppress backlash of the moving mechanism, making it possible to increase the precision of inspecting an electronic component.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
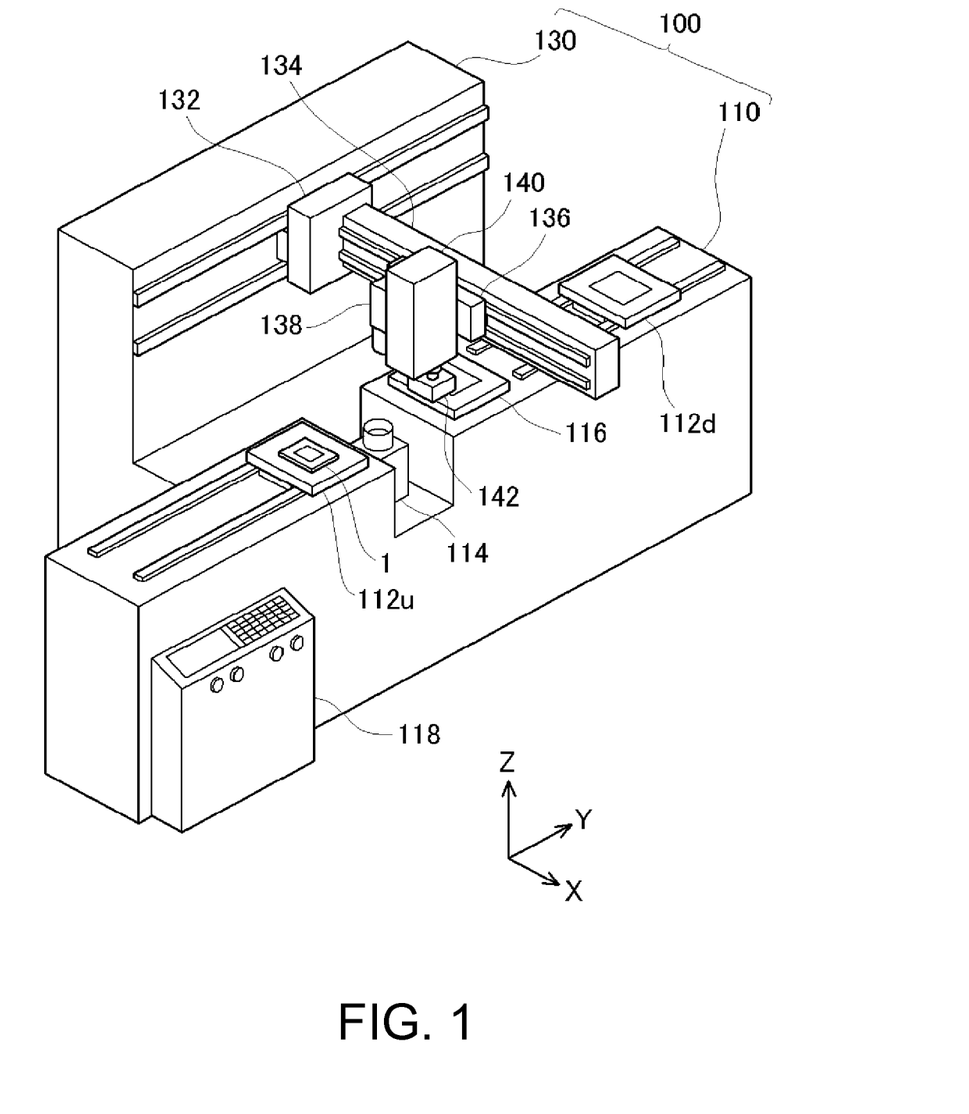
FIG. 1 is a perspective view illustrating an electronic component inspection device in which an exemplary moving mechanism is mounted.

FIG. 1 is a perspective view illustrating an electronic component inspection device 100 in which a moving mechanism 150 is mounted. The illustrated electronic component inspection device 100 broadly includes a base 110 and a support 130 uprightly provided on the lateral surface of the base 110. On the upper surface of the base 110 are provided an upstream-side stage 112u on which an electronic component 1 to be inspected is placed and transported, and a downstream-side stage 112d on which the inspected electronic component 1 is placed and transported. An imaging device 114 for confirming the posture of the electronic component 1 and an inspection table 116 (inspection unit) on which the electronic component 1 is set so as to inspect electrical characteristics are provided between the upstream-side stage 112u and the downstream-side stage 112d. Representative examples of the electronic component 1 include "semiconductors", "semiconductor wafers", "display devices, such as CLDs and OLEDs", "crystal devices", "various sensors", "ink jet heads", "various MEMS devices", and the like.

In the support 130, a Y stage 132 is provided to move in a direction (Y direction) parallel to the upstream-side stage 112u and the downstream-side stage 112d of the base 110, and an arm portion 134 is provided to extend from the Y stage 132 in a direction (X direction) perpendicular to the Y direction toward the base 110. An X stage 136 is provided in the lateral surface of the arm portion 134 to move in the X direction. An imaging camera 138 and a holding device 140 are provided in the X stage 136. As described below, the holding device 140 is embedded with a moving mechanism 150 for finely adjusting the coordinates of the X direction and the Y direction, a Z stage which is movable in an up-down direction (Z direction) perpendicular to the X direction and the Y direction and the like. A holding unit 142 which holds the electronic component 1 is provided at the tip of the holding device 140. A control device 118 which controls the overall operation of the electronic component inspection device 100 is provided on the front surface of the base 110. In this example, the Y stage 132 provided in the support 130, the arm portion 134, the X stage 136, and the holding device 140 correspond to an "electronic component transport device".

The electronic component inspection device 100 having the above configuration inspects the electronic component 1 in the following manner. First, the electronic component 1 to be inspected is placed on the upstream-side stage 112u and moved near the inspection table 116. Next, the Y stage 132 and the X stage 136 are driven to move the holding device 140 to a position directly above the electronic component 1 placed on the upstream-side stage 112u. At this time, the position of the electronic component 1 can be confirmed using the imaging camera 138. The holding unit 142 is moved down using the Z stage embedded in the holding device 140, if the electronic component 1 is held by the holding unit 142, the holding device 140 is moved over the imaging device 114, and the posture (coordinates) of the electronic component 1 is confirmed using the imaging device 114. Subsequently, the posture of the electronic component 1 is adjusted using the moving mechanism 150 embedded in the holding device 140. After the holding device 140 is moved onto the inspection table 116, the Z stage embedded in the holding device 140 is driven to set the electronic component 1 on the inspection table 116. Since the posture of the electronic component 1 is adjusted using the moving mechanism 150 in the holding device 140, the electronic component 1 can be set at a desired position relative to the inspection table 116. After the electrical characteristics of the electronic component 1 are inspected using the inspection table 116, the electronic component 1 is lifted from the inspection table 116, the Y stage 132 and the X stage 136 are driven to move the holding device 140 onto the downstream-side stage 112d, and the electronic component 1 is placed on the downstream-side stage 112d. Thereafter, the downstream-side stage 112d is driven to transfer the inspected electronic component 1 to a predetermined position.

Figure 2:
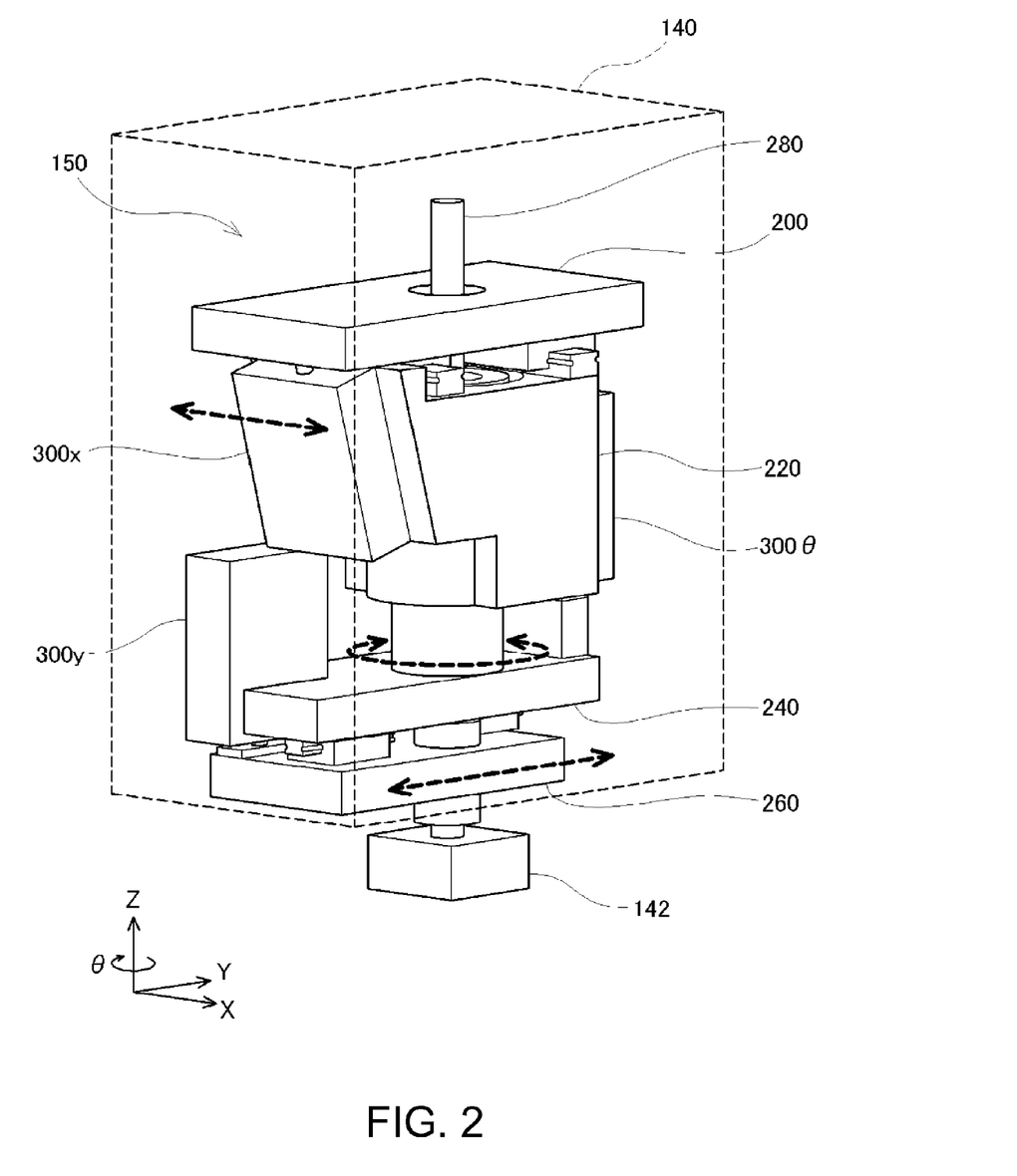
FIG. 2 is a perspective view showing the configuration of the moving mechanism of this example which is embedded in a holding device.

FIG. 2 is a perspective view showing the configuration of the moving mechanism 150 of this example which is embedded in the holding device 140. As shown in FIG. 2, in the moving mechanism 150 of this example, a unit base 200 which supports the entire device is arranged at the uppermost stage, and the unit base 200 is attached to the X stage 136. Below the unit base 200, an X block 220 is provided to move in the X direction with respect to the unit base 200. Below the X block 220, a θ block 240 which is moved with the movement of the X block 220 and rotatable in a rotation direction (θ direction) with the Z direction as an axis is provided. Below the θ block 240, a Y block 260 which is moved with the movement of the θ block 240 and movable in the Y direction with respect to the θ block 240 is provided. A broken-line arrow in the drawing represents the moving direction of each block (220, 240, or 260). The unit base 200 of this example corresponds to a "support", the X block 220 of this example corresponds to a "first moving body", the Y block 260 of this example corresponds to a "second moving body", and the θ block 240 of this example corresponds to a "rotating body".

The moving mechanism 150 is provided with three piezoelectric motors including an X direction piezoelectric motor 300x which drives the X block 220, a θ direction piezoelectric motor 300θ which drives the θ block 240, and a Y direction piezoelectric motor 300y which drives the Y block 260. When it is not necessary to distinguish among the three piezoelectric motors (300x, 300θ, and 300y), these are simply referred to as the piezoelectric motors 300. The operation principle of the piezoelectric motors 300 will be described below.

The moving mechanism 150 is provided with a shaft 280 which passes through the unit base 200, the X block 220, the θ block 240, and the Y block 260 in the up-down direction (Z direction). The shaft 280 is attached to the Y block 260 to move in the Z direction, is moved with the movement of the Y block 260, and moves in the Z direction by the movement of the Z stage (not shown). The holding unit 142 is attached to the lower end of the shaft 280.

Figure 3:
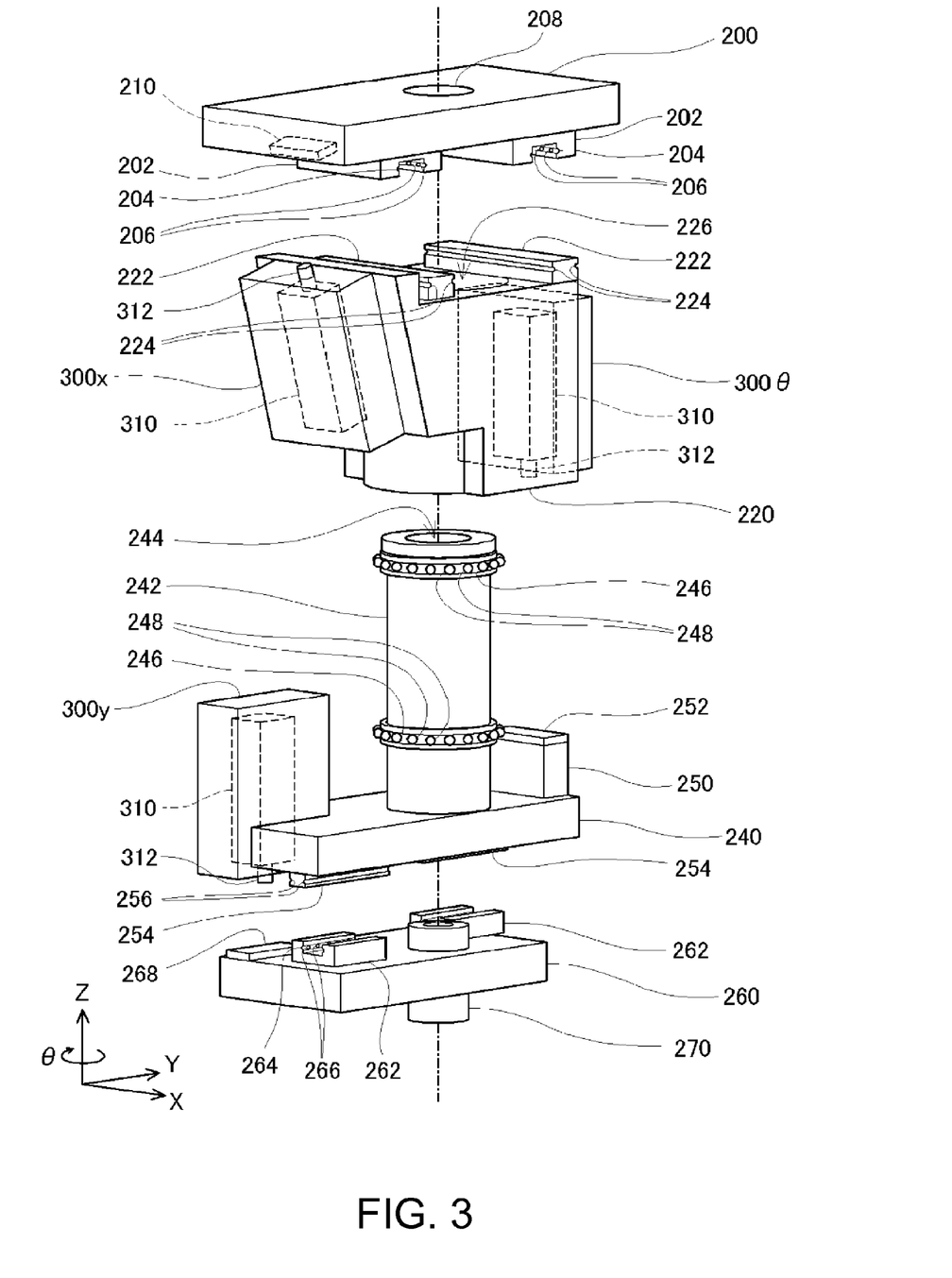
FIG. 3 is an exploded perspective view of the moving mechanism.

FIG. 3 is an exploded perspective view of the moving mechanism 150. As shown in FIG. 3, the unit base 200 has a substantially rectangular flat plate shape, and is provided with a through hole 208 which has a circular cross-section and through which the shaft 280 passes in the Z direction. The size of the through hole 208 is set such that, even if the shaft 280 is moved with the movement of the Y block 260 and moved in the X direction and the Y direction, the shaft 280 does not hit the inner circumferential surface. In the lower surface (the surface facing the X block 220) of the unit base 200, two X rail receivers 202 formed in a downward concave cross-section are provided to extend parallel to the X direction, and the two X rail receivers 202 are arranged spaced apart from each other in the Y direction. In the inner wall surfaces of the X rail receivers 202, outer grooves 204 having a semicircular cross-section are formed, and a plurality of balls 206 are arranged along the outer grooves 204. The outer grooves 204 of this example correspond to "first grooves", and the balls 206 of this example correspond to "rolling bodies".

In the upper surface (the surface facing the unit base 200) of the X block 220, two X rails 222 are provided to extend parallel to the X direction to correspond to the two X rail receivers 202 on the unit base 200 side. In both lateral surfaces of the X rails 222, inner grooves 224 which face the outer grooves 204 of the X rail receivers 202 and have a semicircular cross-section are formed. In a state where the X rails 222 are fitted into the corresponding X rail receivers 202, a plurality of balls 206 are inserted between the inner grooves 224 and the outer grooves 204, and ball guides are formed on both sides of each X rail 222. The balls 206 roll along the inner grooves 224 and the outer grooves 204, whereby the X block 220 moves smoothly with respect to the unit base 200. The inner grooves 224 of this example correspond to "second grooves".

The piezoelectric motor 300x is attached to one side (the near side of the drawing) of the lateral surface of the X block 220 in the Y direction, and the piezoelectric motor 300θ is attached to the other side (the far side of the drawing). A vibrating body 310 which includes a piezoelectric material and has a rectangular parallelepiped shape is embedded in the piezoelectric motor 300, and a columnar ceramic convex portion 312 is provided in the end surface in the longitudinal direction of the vibrating body 310. As described below, the piezoelectric motor 300 of this example has a structure in which the vibrating body 310 is biased toward the side on which the convex portion 312 is provided. The piezoelectric motor 300x which drives the X block 220 is attached in a state where the short direction of the vibrating body 310 conforms to the X direction, and the convex portion 312 of the vibrating body 310 is biased toward the unit base 200. In a portion on the unit base 200 side to which the convex portion 312 is biased, a ceramic pressure receiving body 210 having a substantially rectangular parallelepiped shape is buried. The piezoelectric motor 300θ which drives the θ block 240 is attached in a state where the short direction of the vibrating body 310 conforms to the X direction and the convex portion 312 of the vibrating body 310 faces the θ block 240. The vibrating body 310 embedded in the piezoelectric motor 300x of this example corresponds to a "first vibrating body", and the vibrating body 310 embedded in the piezoelectric motor 300θ of this example corresponds to a "third vibrating body".

In the X block 220, a through hole 226 which has a circular cross-section and through which the shaft 280 passes is provided to pass therethrough in the Z direction. The through hole 226 of the X block 220 is formed such that the inner diameter thereof is greater than that of the through hole 208 of the unit base 200.

A cylindrical guide shaft 242 which is provided with a through hole 244 through which the shaft 280 passes is uprightly provided from the upper surface (the surface facing the X block 220) of the θ block 240. In the outer circumferential surface of the guide shaft 242, two inner grooves 246 having a semicircular cross-section are spaced apart from each other in the up-down direction (Z direction), and a plurality of balls 248 are arranged along the inner grooves 246. The outer diameter of the guide shaft 242 is smaller than the inner diameter of the through hole 226 of the X block 220, and two outer grooves (not shown) are provided in the inner circumferential surface of the through hole 226 to face the inner grooves 246 of the guide shaft 242. In a state where the guide shaft 242 is inserted into the through hole 226 of the X block 220, a plurality of balls 248 are inserted between the inner grooves 246 of the guide shaft 242 and the corresponding outer grooves of the through hole 226, and ring-shaped ball guides are formed. The balls 248 roll along the inner grooves 246 and the outer grooves, whereby the θ block 240 rotates smoothly with respect to the X block 220.

In the upper surface of the θ block 240, a pressure receiving stand 250 is uprightly provided at a position facing the piezoelectric motor 300θ. A ceramic pressure receiving body 252 is attached to the upper surface of the pressure receiving stand 250, and the convex portion 312 of the vibrating body 310 embedded in the piezoelectric motor 300θ is biased.

The piezoelectric motor 300y which drives the Y block 260 is attached to the θ block 240 in a state where the short direction of the vibrating body 310 conforms to the Y direction, and the convex portion 312 of the vibrating body 310 faces the Y block 260. The vibrating body 310 embedded in the piezoelectric motor 300y of this example corresponds to a "second vibrating body".

In the lower surface (the surface facing the Y block 260) of the θ block 240, two Y rails 254 are provided to extend parallel to the Y direction, and the two Y rails 254 are arranged to be spaced apart from each other in the X direction and the Y direction. In both lateral surfaces of the Y rails 254, inner grooves 256 having a semicircular cross-section are formed.

In the upper surface (the surface facing the θ block 240) of the Y block 260, two Y rail receivers 262 are provided to extend parallel to the Y direction to correspond to the two Y rails 254 on the θ block 240 side. The Y rail receivers 262 have an upward concave cross-section, outer grooves 264 having a semicircular cross-section are formed in the inner wall lateral surfaces of the Y rail receivers 262 to face the inner grooves 256 of the Y rails 254, and a plurality of balls 266 are arranged along the outer grooves 264. In a state where the Y rail receivers 262 are fitted into the corresponding Y rails 254, a plurality of balls 266 are inserted between the inner grooves 256 and the outer grooves 264, and ball guides are formed on both sides of each Y rail 254. The balls 266 roll along the inner grooves 256 and the outer grooves 264, whereby the Y block 260 moves smoothly with respect to the θ block 240.

A ceramic pressure receiving body 268 is attached to the upper surface of the Y block 260 at a position facing the piezoelectric motor 300y, and the convex portion 312 of the vibrating body 310 embedded in the piezoelectric motor 300y is biased. In the Y block 260, a cylindrical shaft support portion 270 which supports the shaft 280 to be movable in the Z direction is provided.

In the moving mechanism 150 of this example having the above configuration, of the three piezoelectric motors 300, a voltage is applied to the vibrating body 310 of the piezoelectric motor 300x, whereby the X block 220 can be moved in the X direction with respect to the unit base 200. A voltage is applied to the vibrating body 310 of the piezoelectric motor 300θ, whereby the θ block 240 can be rotated in the θ direction. A voltage is applied to the vibrating body 310 of the piezoelectric motor 300y, whereby the Y block 260 can be moved in the Y direction with respect to the θ block 240.

Figure 4:
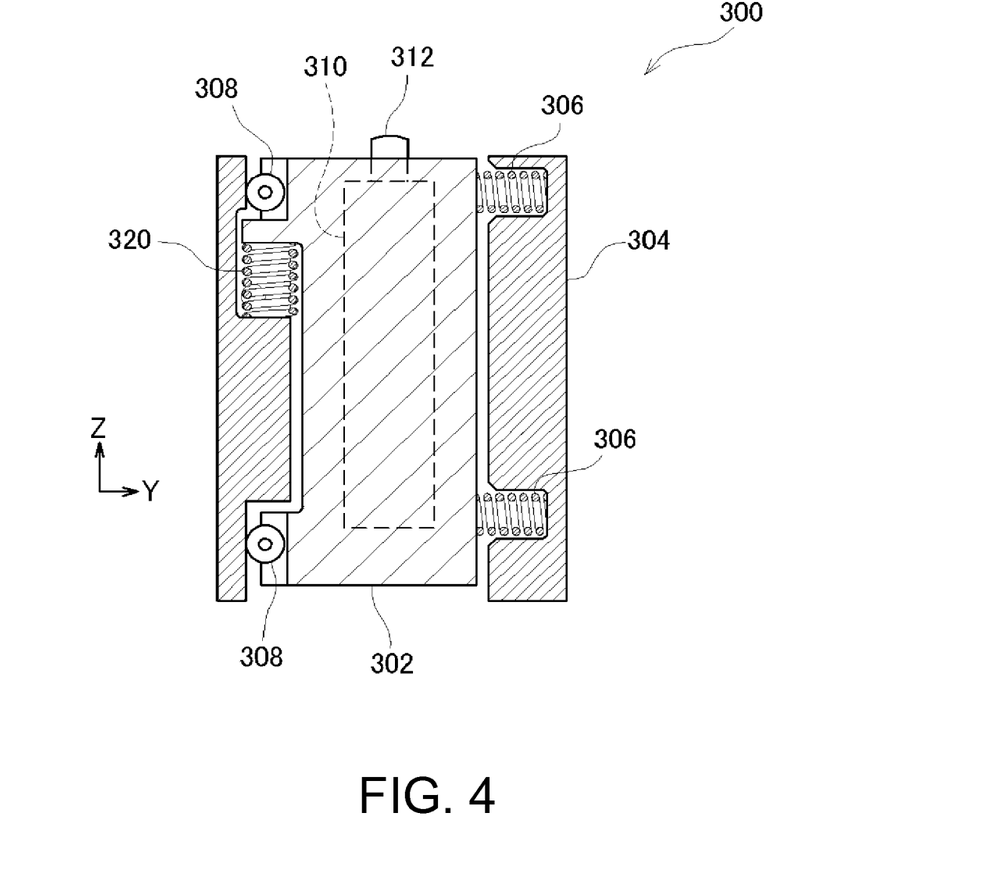
FIG. 4 is a sectional view showing the internal structure of a piezoelectric motor.

FIG. 4 is a sectional view showing the internal structure of the piezoelectric motor 300. As shown in FIG. 3, the moving mechanism 150 of this example is provided with the three piezoelectric motors (300x, 300θ, and 300y), and all the piezoelectric motors 300 have the same basic structure and operation principle. Accordingly, description will be hereinafter provided using the piezoelectric motor 300x as an example. As shown in FIG. 4, the vibrating body 310 is retained in a vibrating body case 302 in a state where the convex portion 312 protrudes, and the vibrating body case 302 is housed in a housing case 304 in a form to be movable in a direction (Z direction) in which the convex portion 312 protrudes. Lateral pressure springs 306 which bias the vibrating body case 302 in the Y direction are provided between one of the lateral surfaces (the surfaces in the Y direction perpendicular to the Z direction) of the vibrating body case 302 and the housing case 304. Rollers 308 which roll in the Z direction are provided between the other lateral surface (the side opposite to the side on which the lateral pressure springs 306 are provided) of the vibrating body case 302 and the housing case 304. As a result, the vibrating body case 302 can move smoothly in the Z direction while the movement in the Y direction is regulated. A biasing spring 320 is provided on the same side as the side on which the rollers 308 are provided, and the biasing spring 320 biases the vibrating body case 302 in the Z direction (the side on which the convex portion 312 is provided). As shown in FIG. 2, in a state where the moving mechanism 150 is assembled, the convex portion 312 of the vibrating body 310 is biased toward the pressure receiving body 210 of the unit base 200, and a voltage is applied to the vibrating body 310, thereby driving the X block 220.

Figure 5A:
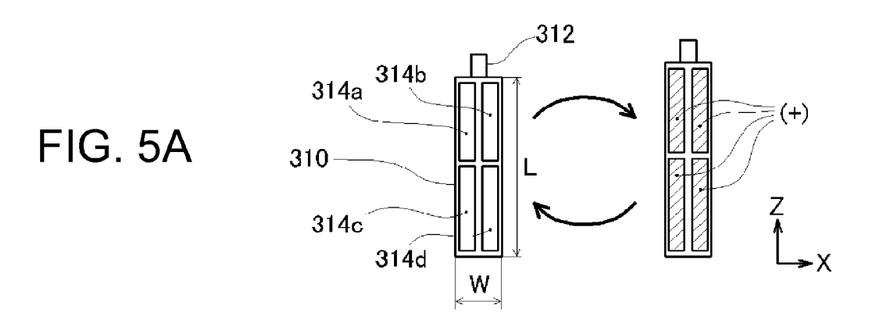
FIGS. 5A to 5C are explanatory views showing the operation principle of the piezoelectric motor.
Figure 5B:
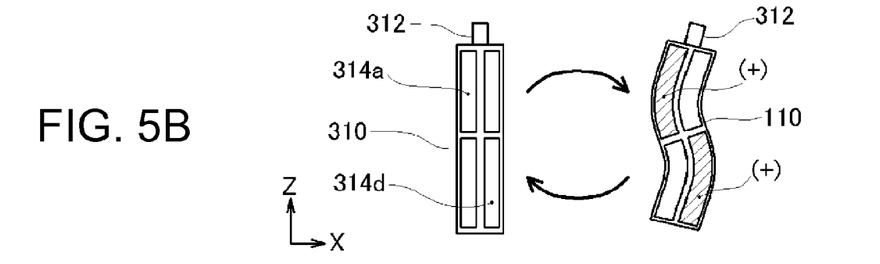
Figure 5C:
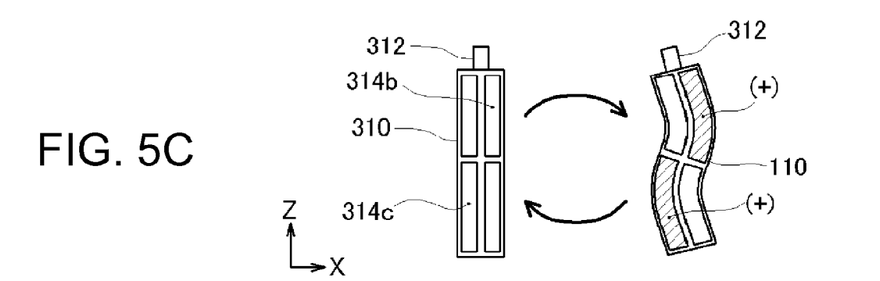

FIGS. 5A to 5C are explanatory views showing the operation principle of the piezoelectric motor 300. As shown in FIG. 5A, in the lateral surface on the front side of the vibrating body 310 embedded in the piezoelectric motor 300x, four rectangular front electrodes 314a to 314d are formed so as to bisect (in total, quadrisect) the lateral surface vertically and horizontally. When it is not necessary to distinguish among the four front electrodes 314a to 314d, these may be simply referred to as the front electrodes 314. Though not shown, in the lateral surface on the rear side of the vibrating body 310, a rear electrode is substantially formed over the entire lateral surface. The piezoelectric motor 300 operates such that, when a voltage is applied to the front electrodes 314 of the vibrating body 310 in a given period, the convex portion 312 of the vibrating body 310 generates elliptical motion. The reason why the convex portion 312 of the vibrating body 310 generates elliptical motion is as follows.

First, the vibrating body 310 including the piezoelectric material has a property to expand if a positive voltage is applied. Accordingly, as shown in FIG. 5A, if an operation to apply a positive voltage to all the four front electrodes 314 and then to release the applied voltage is repeated, the vibrating body 310 repeats an operation to stretch in the longitudinal direction. In this way, the operation of the vibrating body 310 to repeatedly stretch in the longitudinal direction is referred to as "stretching vibration". Hereinafter, the direction (±Z direction in the drawing) in which the vibrating body 310 is stretched is referred to as a "stretching direction". If a frequency at which a positive voltage is applied is changed, when a specific frequency is reached, the stretching amount rapidly increases, and a kind of resonance phenomenon occurs. The frequency (resonance frequency) at which resonance occurs due to stretching vibration is determined by the physical property of the vibrating body 310 and the dimension (width W, length L, thickness T) of the vibrating body 310.

As shown in FIG. 5B or 5C, the positive voltage is applied to a set of diagonally opposite two front electrodes 314 (a set of front electrode 314a and front electrode 314d or a set of front electrode 314b and front electrode 314c) in a given period. Then, the vibrating body 310 repeats an operation such that the tip portion in the longitudinal direction (a portion in which the convex portion 312 is provided) shakes the head thereof in the short direction (the left-right direction of the drawing). For example, as shown in FIG. 5B, if the positive voltage is applied to the set of front electrode 314a and front electrode 314d in a given period, the vibrating body 310 repeats an operation such that the tip portion in the longitudinal direction moves in the right direction. As shown in FIG. 5C, if the positive voltage is applied to the set of front electrode 314b and front electrode 314c in a given period, the vibrating body 310 repeats an operation such that the tip portion in the longitudinal direction moves in the left direction. This operation of the vibrating body 310 is referred to as "bending vibration". Hereinafter, the direction (±X direction in the drawing) in which the vibrating body 310 generates bending vibration is referred to as a "bending direction". In regard to the bending vibration, there is a resonance frequency which is determined by the physical property of the vibrating body 310 and the dimension (width W, length L, thickness T) of the vibrating body 310. Accordingly, if the positive voltage is applied to the diagonally opposite two front electrodes 314 at the resonance frequency, the vibrating body 310 largely shakes the head thereof in the bending direction and generates vibration.

The resonance frequency of the stretching vibration shown in FIG. 5A and the resonance frequency of the bending vibration shown in FIG. 5B or 5C are determined by the physical property of the vibrating body 310 or the dimension (width W, length L, thickness T) of the vibrating body 310. Accordingly, if the dimension (width W, length L, thickness T) of the vibrating body 310 is appropriately selected, the two resonance frequencies can coincide with each other. If the voltage in the form of the bending vibration shown in FIG. 5B or 5C is applied to the vibrating body 310 at the resonance frequency, the bending vibration shown in FIG. 5B or 5C occurs, and the stretching vibration of FIG. 5A is induced by resonance. As a result, when a voltage is applied to the set of front electrode 314a and front electrode 314d in the form shown in FIG. 5B, the tip portion (the portion in which the convex portion 312 is provided) of the vibrating body 310 performs an operation (elliptical motion) to draw an ellipse in a clockwise direction in the drawing. When a voltage is applied to the set of front electrode 314b and front electrode 314c in the form shown in FIG. 5C, the tip portion of the vibrating body 310 performs an elliptical motion in a counterclockwise direction in the drawing. In the above description, a case where the positive voltage is applied to the vibrating body 310 has been described. However, a piezoelectric material is also deformed when a negative voltage is applied. Accordingly, a negative voltage may be applied to the vibrating body 310 to generate bending vibration (and stretching vibration), or an alternating voltage in which a positive voltage and a negative voltage are repeated may be applied to generate bending vibration (and stretching vibration). In the above description, a case where the voltage at the resonance frequency is applied has been described. However, it should suffice that a voltage which has a waveform including the resonance frequency is applied, and for example, a pulsed voltage may be applied.

The piezoelectric motor 300x drives the X block 220 using the elliptical motion. That is, as shown in FIG. 3, the piezoelectric motor 300x generates the elliptical motion in a state where the short direction (bending direction) of the vibrating body 310 is fixed to the X block 220 side in conformity with the X direction, and the convex portion 312 of the vibrating body 310 is biased toward the pressure receiving body 210 of the unit base 200. Then, the convex portion 312 repeats an operation to move toward one side of the bending direction while being biased toward the pressure receiving body 210 when the vibrating body 310 expands and to return to the original position while being separated from the pressure receiving body 210 when the vibrating body 310 contracts. As a result, the X block 220 moves toward the other side of the bending direction (X direction) with respect to the unit base 200 by a frictional force which acts between the pressure receiving body 210 and the convex portion 312.

The piezoelectric motor 300θ is fixed to the X block 220 side, and the convex portion 312 of the vibrating body 310 is biased toward the pressure receiving body 252 of the pressure receiving stand 250 provided on the θ block 240 side. As a result, if the piezoelectric motor 300θ is operated, the θ block 240 rotates in the θ direction by a frictional force which acts between the convex portion 312 and the pressure receiving body 252.

The piezoelectric motor 300y is fixed to the θ block 240 side in a state where the short direction (bending direction) of the vibrating body 310 conforms to the Y direction, and the convex portion 312 of the vibrating body 310 is biased toward the pressure receiving body 268 provided on the Y block 260 side. As a result, if the piezoelectric motor 300y is operated, the Y block 260 moves in the Y direction with respect to the θ block 240 by a frictional force which acts between the convex portion 312 and the pressure receiving body 268. Accordingly, in the electronic component inspection device 100, the piezoelectric motor 300x, the piezoelectric motor 300θ, and the piezoelectric motor 300y of the moving mechanism 150 are operated, whereby the posture of the electronic component 1 held by the holding unit 142 can be finely adjusted. In addition, the piezoelectric motor 300 is easily reduced in size as compared to an electromagnetic motor which rotates a rotor using an electromagnetic force, and can directly transmit a driving force without a gear or the like. For this reason, the piezoelectric motor 300 is used for an actuator of the moving mechanism 150, thereby achieving a reduction in the size of the moving mechanism 150.

In the moving mechanism 150 of this example, the X block 220, the θ block 240, and the Y block 260 are provided to move in different directions (the X direction, the θ direction, and the Y direction), and a load or the like is applied to the respective blocks (220, 240, and 260), causing backlash in some cases. In particular, since the weight of the θ block 240 or the Y block 260 is applied to the X block 220 near the unit base 200 which supports the entire moving mechanism 150, backlash is likely to occur, and backlash of the X block 220 is transmitted to the θ block 240 or the Y block 260 which is moved with the movement of the X block 220, causing large backlash in the entire moving mechanism 150. Accordingly, in the moving mechanism 150 of this example, backlash is suppressed in the following manner.

Figure 6:
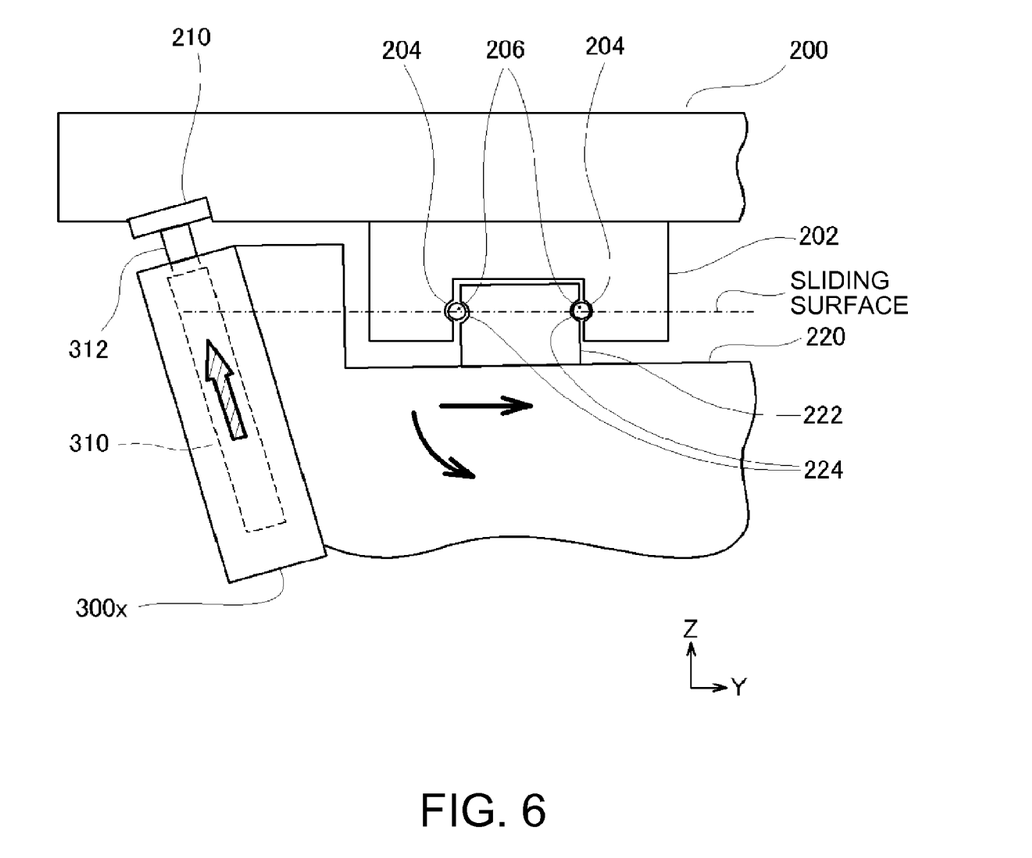
FIG. 6 is a sectional view of the moving mechanism taken along a plane perpendicular to an X direction.

FIG. 6 is a sectional view of the moving mechanism 150 taken along a plane perpendicular to the X direction. In FIG. 6, a portion near where the piezoelectric motor 300x is attached to the X block 220 is shown in an enlarged scale. As described above, a plurality of balls 206 are inserted between the outer grooves 204 formed in the X rail receivers 202 on the unit base 200 side and the inner grooves 224 formed in the X rails 222 on the X block 220 side, and with the plurality of balls 206, the ball guides parallel to the X direction are formed on both sides of the X rails 222. The plurality of balls 206 roll along the two rows of ball guides, whereby the X block 220 moves smoothly with respect to the unit base 200. Hereinafter, a plane including the two rows of ball guides is referred to as a "moving surface". In order to allow the smooth rolling of the balls 206, a slight clearance (allowance) is provided between the balls 206 and the inner grooves 224 or the outer grooves 204.

In the piezoelectric motor 300x attached to the lateral surface of the X block 220, the short direction (bending direction) of the embedded vibrating body 310 conforms to the X direction, and the upper end side (the side on which the convex portion 312 is provided) is obliquely fixed to an opposite side of the X block 220. The vibrating body 310 is biased in the longitudinal direction (stretching direction) by the biasing spring 320, and the convex portion 312 is biased toward the pressure receiving body 210 of the unit base 200. For this reason, the direction (biasing direction) in which the convex portion 312 of the vibrating body 310 is biased toward the pressure receiving body 210 is inclined at a predetermined angle (in the illustrated example, 75 degrees) with respect to the moving surface.

The pressure receiving body 210 of this example is formed in a substantially rectangular parallelepiped shape, and is buried in the unit base 200 in a state where the lower surface (the surface with which the convex portion 312 of the vibrating body 310 comes into contact) is perpendicular to the biasing direction of the vibrating body 310. Accordingly, even if the convex portion 312 of the vibrating body 310 is obliquely biased with respect to the lower surface of the unit base 200, the position of the pressure receiving body 210 is not shifted in the horizontal direction (Y direction) by the biasing force, and the X block 220 can be moved with respect to the unit base 200 with high precision by the frictional force which acts between the convex portion 312 and the pressure receiving body 210. In the moving mechanism 150 of this example, while the unit base 200 is formed of a plastic material, the pressure receiving body 210 is formed of a material, such as a ceramic material or a metal material, having a hardness that is higher than that of a plastic material. As a result, it is possible to suppress abrasion of the pressure receiving body 210 by the frictional force which acts between the convex portion 312 and the pressure receiving body 210.

The X block 220 receives a reaction force in a direction opposite to the biasing direction when the convex portion 312 of the vibrating body 310 embedded in the piezoelectric motor 300x is biased toward the pressure receiving body 210 of the unit base 200. The reaction force includes a component in the right direction of the drawing parallel to the moving surface and a component in the lower direction of the drawing perpendicular to the moving surface. The X block 220 receives the reaction force parallel to the moving surface, whereby in the ball guide on the side (the right side of the drawing) away from the piezoelectric motor 300x of the ball guides on both sides of each X rail 222, the clearance between the balls 206 and the inner and outer grooves 224 and 204 is narrowed, and the balls 206 are pinched between the inner grooves 224 and the outer grooves 204.

In the ball guide on the side (the left side of the drawing) near the piezoelectric motor 300x, while the clearance between the inner grooves 224 and the outer grooves 204 is extended, the X block 220 receives the reaction force perpendicular to the moving surface, whereby a moment which allows the downward rotation of the X block 220 with the ball guide having the clearance narrowed on the right side of the drawing as an axis is generated, and the balls 206 are pinched between the upper end side of the inner grooves 224 and the lower end side of the outer grooves 204.

As described above, in the moving mechanism 150 of this example, the biasing direction of the vibrating body 310 is inclined with respect to the moving surface, whereby the balls 206 can be pinched between the inner grooves 224 and the outer grooves 204 in all of the ball guides on both sides of each X rail 222. In one ball guide, the balls 206 are pinched in a direction parallel to the moving surface, and in the other ball guide, the balls 206 are pinched in a direction perpendicular to the moving surface, that is, the pinching direction differs between the ball guides. As a result, even if a load is applied to the X block 220 from an arbitrary direction, it is possible to suppress backlash of the X block 220. In this way, backlash of the X block 220 which is arranged near the unit base 200 and receives the weight of the θ block 240 and the Y block 260 is suppressed, thereby increasing the rigidity of the entire moving mechanism 150.

In the moving mechanism 150 of this example, the X block 220 which moves in the X direction is arranged at an upper stage position near the unit base 200, and the Y block 260 which moves in the Y direction is arranged at a lower stage position away from the unit base 200. The reason for this is as follows. First, as described above, in the electronic component inspection device 100, the holding device 140 embedded with the moving mechanism 150 is attached to the X stage 136, and the Y stage 132 and the X stage 136 are driven to move the holding device 140 on an X-Y plane. When moving the electronic component 1 to the inspection table 116, since the Y stage 132 is primarily driven, an inertial force in the Y direction acts on the moving mechanism 150. The X block 220 which is movable in the X direction perpendicular to the Y direction does not receive an inertial force in the moving direction. As a result, if the X block 220 is arranged at the upper stage position near the unit base 200, even if the weight of the θ block 240 and the Y block 260 is applied to the X block 220, it is possible to prevent the misalignment (skidding in the moving direction) of the X block 220 by the inertial force. The Y stage 132 of this example corresponds to a "transfer body".

While the Y block 260 which is movable in the Y direction receives the inertial force in the moving direction, if the Y block 260 is arranged at the lower stage position where the weight of other blocks (220 and 240) is not applied, a large inertial force does not act on the Y block 260, and it is possible to suppress misalignment (skidding in the moving direction) of the Y block 260. As a result, it is not necessary to further provide a brake mechanism or the like so as to prevent misalignment of the Y block 260 by the inertial force, thereby achieving a reduction in the size of the moving mechanism 150.

In the moving mechanism 150 of this example, the θ block 240 is provided between the X block 220 and the Y block 260, and the piezoelectric motor 300θ which drives the θ block 240 is arranged in a state where the short direction (bending direction) of the embedded vibrating body 310 conforms to the X direction. If the piezoelectric motor 300θ is arranged in this way, even if the inertial force in the Y direction is applied to the moving mechanism 150 along with the movement of the Y stage 132, a direction (the bending direction of the vibrating body 310) in which a frictional force acts between the convex portion 312 of the vibrating body 310 and the pressure receiving body 252 and an inertial direction do not overlap each other, thereby suppressing misalignment (skidding in the θ direction) of the θ block 240 by the inertial force.

Although the moving mechanism according to the example of the invention and various devices in which the moving mechanism is mounted have been described, the invention is not limited to the foregoing, and may be carried out in various forms within a scope not departing from the gist of the invention.

For example, although in the above-described example, the X block 220, the θ block 240, and the Y block 260 are arranged in this order downward from the unit base 200, the arrangement of the blocks is not limited thereto, and for example, the θ block 240, the X block 220, and the Y block 260 may be arranged in this order. In this case, in the piezoelectric motor 300θ which drives the θ block 240, the biasing direction of the vibrating body 310 may be arranged obliquely with respect to the moving surface which includes the ring-shaped ball guide having a plurality of balls 248. Accordingly, a force parallel to the moving surface and a force perpendicular to the moving surface are applied to the θ block 240, and at one location of two locations symmetrical to the center of the ring-shaped ball guide, the clearance between the inner grooves 246 and the outer grooves is narrowed by the force parallel to the moving surface, and the balls 248 are pinched between the inner grooves 246 and the outer grooves. At the other location, while the clearance between the inner grooves 246 and the outer grooves is extended, a moment which allows the rotation of the θ block 240 with one location as an axis is generated by the force perpendicular to the moving surface, and the balls 248 are pinched between the inner grooves 246 and the outer grooves in the up-down direction (the direction perpendicular to the moving surface). As a result, backlash of the θ block 240 arranged near the unit base 200 is suppressed, thereby increasing the rigidity of the entire moving mechanism 150. It is preferable that the Y block 260 on which the inertial force acts in the moving direction along with the movement of the Y stage 132 is arranged at the lower stage position where weight of the other blocks (220 and 240) is not applied, thereby reducing the inertial force which acts on the Y block 260.

Although in the above-described example, only in the piezoelectric motor 300x which drives the X block 220 near the unit base 200, the biasing direction of the vibrating body 310 is arranged obliquely with respect to the moving surface, similarly, in the piezoelectric motor 300θ and the piezoelectric motor 300y, the biasing direction of the vibrating body 310 may be arranged obliquely with respect to the moving surface. With this, since backlash of the θ block 240 or the Y block 260 is suppressed, it is possible to further increase rigidity of the entire moving mechanism 150.

Although in the above-described example, a configuration in which the piezoelectric motor 300x is fixed to the X block 220 side, and the convex portion 312 of the vibrating body 310 is biased toward the unit base 200 side (pressure receiving body 210) has been made, conversely, a configuration in which the piezoelectric motor 300x is fixed to the unit base 200 side, and the convex portion 312 of the vibrating body 310 is biased toward the X block 220 side may be made. In this case, the X block 220 directly receives the biasing force of the vibrating body 310. The biasing direction of the vibrating body 310 is inclined with respect to the moving surface, whereby the biasing force received by the X block 220 includes a component parallel to the moving surface and a component perpendicular to the moving surface. As a result, as in the above-described example, the balls 206 can be pinched between the inner grooves 224 and the outer grooves 204 in all of the ball guides on both sides of each X rail 222, thereby suppressing backlash of the X block 220.

Although in the above-described example, a configuration in which the X block 220, the θ block 240, and the Y block 260 hang downward from the unit base 200 is described, the invention is not limited thereto, and a configuration in which the X block 220, the θ block 240, and the Y block 260 are arranged upward with respect to the unit base 200 may be made. Also in this case, in the piezoelectric motor 300x which drives the X block 220 arranged near the unit base 200, if the biasing direction of the vibrating body 310 is arranged obliquely with respect to the moving surface, it is possible to suppress backlash of the X block 220 on the base end side to which the weight of other blocks (240 and 260) is applied, thereby increasing the rigidity of the entire moving mechanism 150.

In the above-described example, the cross-section shapes of the outer grooves 204 and the inner grooves 224 are semicircular. However, the cross-section shapes of the outer grooves 204 and the inner grooves 224 are not limited thereto, and any shape may be used insofar as the rolling bodies, such as the balls 206, are rotatably pinched. For example, a V shape may be used.

In the above-described example, a plurality of balls 206 are inserted as rolling bodies between the outer grooves 204 and the inner grooves 224. However, the rolling bodies are not limited to the balls 206 insofar as the rolling bodies can roll between the outer grooves 204 and the inner grooves 224 to smoothly move the X block 220. For example, a cross roller in which cylindrical rollers are arranged to be alternately perpendicular to one another along the outer grooves 204 and the inner grooves 224 may be used. In the cross roller, the rollers come into linear contact with the V grooves, whereby the rollers can endure a high load. As a result, if the cross roller is used, it is possible to increase rigidity of the moving mechanism 150.

The entire disclosure of Japanese Patent Application No. 2012-132651 filed Jun. 12, 2012 is expressly incorporated by reference herein.

What is claimed is:

1. A moving mechanism comprising:
a support provided at a predetermined position and supporting the moving mechanism;
a first moving body which is movable in a first direction with respect to the support;
a first vibrating body which includes a piezoelectric material to generate vibration in the first direction and is supported by one of the support and the first moving body while being biased toward the other one of the support and the first moving body;
a second moving body which is provided on a side of the support with the first moving body therebetween, is moved with the movement of the first moving body, and is movable in a second direction intersecting the first direction with respect to the first moving body;
a second vibrating body which includes a piezoelectric material to generate vibration in the second direction and is supported by one of the first moving body and the second moving body while being biased toward the other one of the first moving body and the second moving body;
a pair of first grooves which are provided in the support and formed parallel to the first direction;
a pair of second grooves which are provided in the first moving body and face the first grooves;
a plurality of rolling bodies which are provided between the first grooves and the second grooves, and roll in accordance with movement of the first moving body; and
a moving shaft which includes the rolling bodies and is parallel to the first direction,
wherein two rows of the moving shafts are spaced apart from each other in a direction intersecting a direction in which the support and the first moving body face each other,
a direction in which the first grooves and the second grooves face each other intersects a direction in which the support and the first moving body face each other, and the positional relationship between the first grooves and the second grooves is reversed between the two rows of moving shafts, and
a biasing direction in which the first vibrating body is biased is inclined with respect to a moving surface including the two rows of moving shafts.

2. The moving mechanism according to claim 1,
wherein the support is provided in a transfer body which transfers the moving mechanism in a predetermined transfer direction, and
the first direction is different from the transfer direction of the transfer body.

3. The moving mechanism according to claim 2, further comprising:
a rotating body which rotates around a third direction perpendicular to the first direction and the second direction as an axis; and
a third vibrating body which includes a piezoelectric material to generate vibration and drive the rotating body by the vibration,
wherein the direction of vibration which is generated by the third vibrating body is a direction different from the transfer direction of the transfer body.

4. The moving mechanism according to claim 1,
wherein, in a portion of one of the support and the first moving body to which the first vibrating body is biased, a pressure receiving body which is formed in a substantially rectangular parallelepiped shape is provided in a posture such that a surface with which the vibrating body comes into contact with and the biasing direction are perpendicular to each other.

5. The moving mechanism according to claim 4,
wherein the pressure receiving body is formed of a material having a hardness that is higher than that of the support or the moving body to which the pressure receiving body is provided.

6. An electronic component transport device comprising:
a holding unit which holds an electronic component; and
a moving mechanism which moves the holding unit holding the electronic component,
wherein the moving mechanism includes:
a support provided at a predetermined position and supporting the moving mechanism,
a first moving body which is movable in a first direction with respect to the support,
a first vibrating body which includes a piezoelectric material to generate vibration in the first direction and is supported by one of the support and the first moving body while being biased toward the other one of the support and the first moving body, a second moving body which is provided on a side of the support with the first moving body therebetween, is moved with the movement of the first moving body, and is movable in a second direction intersecting the first direction with respect to the first moving body, a second vibrating body which includes a piezoelectric material to generate vibration in the second direction and is supported by one of the first moving body and the second moving body while being biased toward the other one of the first moving body and the second moving body, a pair of first grooves which are provided in the support and formed parallel to the first direction, a pair of second grooves which are provided in the first moving body and face the first grooves, a plurality of rolling bodies which are provided between the first grooves and the second grooves, and roll in accordance with movement of the first moving body, and a moving shaft which includes the rolling bodies and is parallel to the first direction, two rows of the moving shafts are spaced apart from each other in a direction intersecting a direction in which the support and the first moving body face each other, a direction in which the first grooves and the second grooves face each other intersects a direction in which the support and the first moving body face each other, and the positional relationship between the first grooves and the second grooves is reversed between the two rows of moving shafts, and a biasing direction in which the first vibrating body is biased is inclined with respect to a moving surface including the two rows of moving shafts.

7. An electronic component inspection device comprising:
a holding unit which holds an electronic component;
a moving mechanism which moves the holding unit holding the electronic component; and
an inspection unit which inspects the electronic component,
wherein the moving mechanism includes:
   a support which is provided at a predetermined position and supports the moving mechanism,
   a first moving body which is movable in a first direction with respect to the support,
   a first vibrating body which includes a piezoelectric material to generate vibration in the first direction and is supported by one of the support and the first moving body while being biased toward the other one of the support and the first moving body,
   a second moving body which is provided on a side of the support with the first moving body therebetween, is moved with the movement of the first moving body, and is movable in a second direction intersecting the first direction with respect to the first moving body,
   a second vibrating body which includes a piezoelectric material to generate vibration in the second direction and is supported by one of the first moving body and the second moving body while being biased toward the other one of the first moving body and the second moving body,
   a pair of first grooves which are provided in the support and formed parallel to the first direction,
   a pair of second grooves which are provided in the first moving body and face the first grooves,
   a plurality of rolling bodies which are provided between the first grooves and the second grooves, and roll in accordance with movement of the first moving body, and
   a moving shaft which includes the rolling bodies and is parallel to the first direction,
two rows of the moving shafts are spaced apart from each other in a direction intersecting a direction in which the support and the first moving body face each other,
a direction in which the first grooves and the second grooves face each other intersects a direction in which the support and the first moving body face each other, and the positional relationship between the first grooves and the second grooves is reversed between the two rows of moving shafts, and
a biasing direction in which the first vibrating body is biased is inclined with respect to a moving surface including the two rows of moving shafts.

8. A moving mechanism comprising:
a support which supports a movable mechanism;
a first moving body which is arranged to move in a first direction with respect to the support;
a first groove which is provided in the support and formed parallel to the first direction;
a first vibrating body which is arranged in the support and biased to press the first moving body or is arranged in the first moving body and biased to press the support;
a second moving body which is provided on a side of the support with the first moving body therebetween and is movable in a second direction intersecting the first direction with respect to the first moving body;
a second groove which is provided in the first moving body, is formed parallel to the moving direction, and is formed at a position facing the first groove;
a second vibrating body which is arranged in the first moving body and biased to press the second moving body or is arranged in the second moving body and biased to press the first moving body;
a rotating body which rotates around a third direction perpendicular to the first direction and the second direction as an axis; and
a third vibrating body which drives the rotating body,
wherein a direction in which the first groove and the second groove face each other intersects a direction in which the support and the first moving body face each other, and
a biasing direction in which the first vibrating body is biased intersects the direction in which the first groove and the second groove face each other and the direction in which the support and the first moving body face each other.

9. The moving mechanism according to claim 8,
wherein the support is provided in a transfer body which transfers the moving mechanism in a predetermined transfer direction, and
the first direction is a direction different from the transfer direction of the transfer body.

10. The moving mechanism according to claim 8,
wherein the rotating body is arranged between the first moving body and the second moving body.

11. The moving mechanism according to claim 8,
wherein a pressure receiving body is arranged in a portion of one of the support and the first moving body to which the first vibrating body is biased, and
a surface of the pressure receiving body with which the first vibrating body comes into contact and the biasing direction are perpendicular to each other.

12. The moving mechanism according to claim 11,
wherein the pressure receiving body is formed of a material having a hardness that is higher than a hardness of the support or the moving body to which the pressure receiving body is arranged.

13. The moving mechanism according to claim 8,
wherein the first vibrating body, the second vibrating body, and the third vibrating body include a piezoelectric material, and generate vibration stretching in the biasing direction and vibration bending in a direction perpendicular to the biasing direction.

14. The moving mechanism according to claim 13,
wherein the first vibrating body, the second vibrating body, and the third vibrating body are pressed by an elastic member in a direction perpendicular to the biasing direction.

15. An electronic component transport device comprising:
a holding unit which holds an electronic component;
a support which supports a movable mechanism;
a first moving body which is arranged to move in a first direction with respect to the support;
a first groove which is provided in the support and formed parallel to the first direction;
a first vibrating body which is arranged in the support and biased to press the first moving body or is arranged in the first moving body and biased to press the support;
a second moving body which is provided with the holding unit, is provided on a side of the support with the first moving body therebetween, and is movable in a second direction intersecting the first direction with respect to the first moving body;
a second groove which is provided in the first moving body, is formed parallel to the moving direction, and is formed at a position facing the first groove;
a second vibrating body which is arranged in the first moving body and biased to press the second moving body or is arranged in the second moving body and biased to press the first moving body;
a rotating body which rotates around a third direction perpendicular to the first direction and the second direction as an axis; and
a third vibrating body which drives the rotating body,
wherein a direction in which the first groove and the second groove face each other intersects a direction in which the support and the first moving body face each other, and
a biasing direction in which the first vibrating body is biased intersects the direction in which the first groove and the second groove face each other and the direction in which the support and the first moving body face each other.

16. An electronic component inspection device comprising:
a holding unit which holds an electronic component;
an inspection unit which inspects the electronic component;
a support which supports a movable mechanism;
a first moving body which is arranged to move in a first direction with respect to the support;
a first groove which is provided in the support and formed parallel to the first direction;
a first vibrating body which is arranged in the support and biased to press the first moving body or is arranged in the first moving body and biased to press the support;
a second moving body which is provided with the holding unit, is provided on a side of the support with the first moving body therebetween, and is movable in a second direction intersecting the first direction with respect to the first moving body;
a second groove which is provided in the first moving body, is formed parallel to the moving direction, and is formed at a position facing the first groove;
a second vibrating body which is arranged in the first moving body and biased to press the second moving body or is arranged in the second moving body and biased to press the first moving body;
a rotating body which rotates around a third direction perpendicular to the first direction and the second direction as an axis; and
a third vibrating body which drives the rotating body,
wherein a direction in which the first groove and the second groove face each other intersects a direction in which the support and the first moving body face each other, and
a biasing direction in which the first vibrating body is biased intersects the direction in which the first groove and the second groove face each other and the direction in which the support and the first moving body face each other.

* * * * *